(12) United States Patent
Colinge et al.

(10) Patent No.: US 10,461,190 B2
(45) Date of Patent: Oct. 29, 2019

(54) METHOD FOR REDUCING CONTACT RESISTANCE IN SEMICONDUCTOR STRUCTURES

(71) Applicant: Taiwan Semiconductor Manufacturing Co., Ltd., Hsinchu (TW)

(72) Inventors: Jean-Pierre Colinge, Hsinchu (TW); Carlos H. Diaz, Mountain View, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 77 days.

(21) Appl. No.: 15/893,316

(22) Filed: Feb. 9, 2018

(65) Prior Publication Data

US 2018/0166575 A1    Jun. 14, 2018

Related U.S. Application Data

(62) Division of application No. 15/209,224, filed on Jul. 13, 2016, now Pat. No. 9,893,189.

(51) Int. Cl.
| | |
|---|---|
| *H01L 29/66* | (2006.01) |
| *H01L 29/78* | (2006.01) |
| *H01L 29/08* | (2006.01) |
| *H01L 21/265* | (2006.01) |
| *H01L 21/02* | (2006.01) |
| *H01L 29/165* | (2006.01) |

(Continued)

(52) U.S. Cl.
CPC .... *H01L 29/7851* (2013.01); *H01L 21/02532* (2013.01); *H01L 21/02576* (2013.01); *H01L 21/02592* (2013.01); *H01L 21/02636* (2013.01); *H01L 21/02667* (2013.01); *H01L 21/26513* (2013.01); *H01L 29/0847* (2013.01); *H01L 29/165* (2013.01); *H01L 29/41791* (2013.01); *H01L 29/665* (2013.01); *H01L 29/66636* (2013.01); *H01L 29/66795* (2013.01); *H01L 29/7848* (2013.01); *H01L 29/45* (2013.01); *H01L 29/456* (2013.01)

(58) Field of Classification Search
CPC ............. H01L 29/7851; H01L 29/0847; H01L 29/165; H01L 29/41791; H01L 29/665; H01L 21/02532; H01L 21/02576; H01L 21/02592; H01L 21/02667; H01L 21/26513
See application file for complete search history.

(56) References Cited

U.S. PATENT DOCUMENTS

| | | |
|---|---|---|
| 8,448,100 B1 | 5/2013 | Lin et al. |
| 8,631,372 B2 | 1/2014 | Yu et al. |
| 8,669,780 B2 | 3/2014 | Chi |

(Continued)

*Primary Examiner* — Nathan W Ha
(74) *Attorney, Agent, or Firm* — Sterne, Kessler, Goldstein & Fox P.L.L.C.

(57) ABSTRACT

Semiconductor structures and methods reduce contact resistance, while retaining cost effectiveness for integration into the process flow by introducing a heavily-doped contact layer disposed between two adjacent layers. The heavily-doped contact layer may be formed through a solid-phase epitaxial regrowth method. The contact resistance may be tuned by adjusting dopant concentration and contact area configuration of the heavily-doped epitaxial contact layer.

20 Claims, 12 Drawing Sheets

(51) Int. Cl.
*H01L 29/417* (2006.01)
*H01L 29/45* (2006.01)

(56) References Cited

U.S. PATENT DOCUMENTS

| | | | |
|---|---|---|---|
| 8,701,073 | B1 | 4/2014 | Fu et al. |
| 8,754,818 | B2 | 6/2014 | Yen et al. |
| 8,896,094 | B2 | 11/2014 | Yen et al. |
| 9,016,939 | B2 | 4/2015 | Chang et al. |
| 9,034,700 | B1 * | 5/2015 | Jeong ............ H01L 29/66818 257/E21.623 |
| 9,086,452 | B2 | 7/2015 | Wang et al. |
| 9,165,968 | B2 | 10/2015 | Chao et al. |
| 9,171,798 | B2 | 10/2015 | Lin et al. |
| 9,172,242 | B2 | 10/2015 | Chang et al. |
| 9,219,038 | B2 | 12/2015 | Horng et al. |
| 9,450,047 | B1 | 9/2016 | Liao et al. |
| 2013/0193981 | A1 | 8/2013 | Chen et al. |
| 2013/0246990 | A1 | 9/2013 | Yen et al. |
| 2013/0320553 | A1 | 12/2013 | Kuo et al. |
| 2014/0126274 | A1 | 5/2014 | Lee et al. |
| 2014/0167799 | A1 | 6/2014 | Wang et al. |
| 2014/0195728 | A1 | 7/2014 | Hsu et al. |
| 2014/0239427 | A1 | 8/2014 | Huang et al. |
| 2014/0264575 | A1 * | 9/2014 | Tsai ............ H01L 29/66492 257/336 |
| 2014/0266273 | A1 | 9/2014 | Wang et al. |
| 2014/0312398 | A1 | 10/2014 | Ching et al. |
| 2015/0108582 | A1 | 4/2015 | Chen et al. |
| 2015/0340502 | A1 * | 11/2015 | Ponoth ............ H01L 29/1054 257/402 |
| 2016/0204261 | A1 * | 7/2016 | Jacob ............ H01L 29/7851 257/401 |
| 2016/0254351 | A1 * | 9/2016 | Tsai ............ H01L 29/0847 257/77 |
| 2016/0365446 | A1 | 12/2016 | Chang et al. |
| 2017/0033105 | A1 | 2/2017 | Wang |
| 2017/0098613 | A1 | 4/2017 | Lin et al. |
| 2017/0133506 | A1 | 5/2017 | Yu et al. |
| 2017/0141197 | A1 | 5/2017 | Alptekin et al. |
| 2017/0141215 | A1 | 5/2017 | Ching et al. |
| 2017/0154990 | A1 | 6/2017 | Sung et al. |

* cited by examiner

METHOD FOR REDUCING CONTACT RESISTANCE IN SEMICONDUCTOR STRUCTURES

CROSS-REFERENCE TO RELATED APPLICATION

This application is a divisional application of U.S. patent application Ser. No. 15/209,224, titled "Method For Reducing Contact Resistance In Semiconductor Structures," filed Jul. 13, 2016, the disclosure of which is incorporated by reference in its entirety.

BACKGROUND

Many developments in both semiconductor structures and manufacturing processes have contributed to reducing the size and increasing the performance of integrated circuits. One recent advance in semiconductor structures has been the introduction of a transistor structure referred to as a finFET. FinFET transistors typically have advantages such as greater channel control, reduced short channel effect, and lower subthreshold leakage currents.

Integrated circuits often include electrical components in addition to transistors, such as, for example, diodes, capacitors, and resistors, each of which may be combined with FinFETs to form an electrical circuit.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1A:
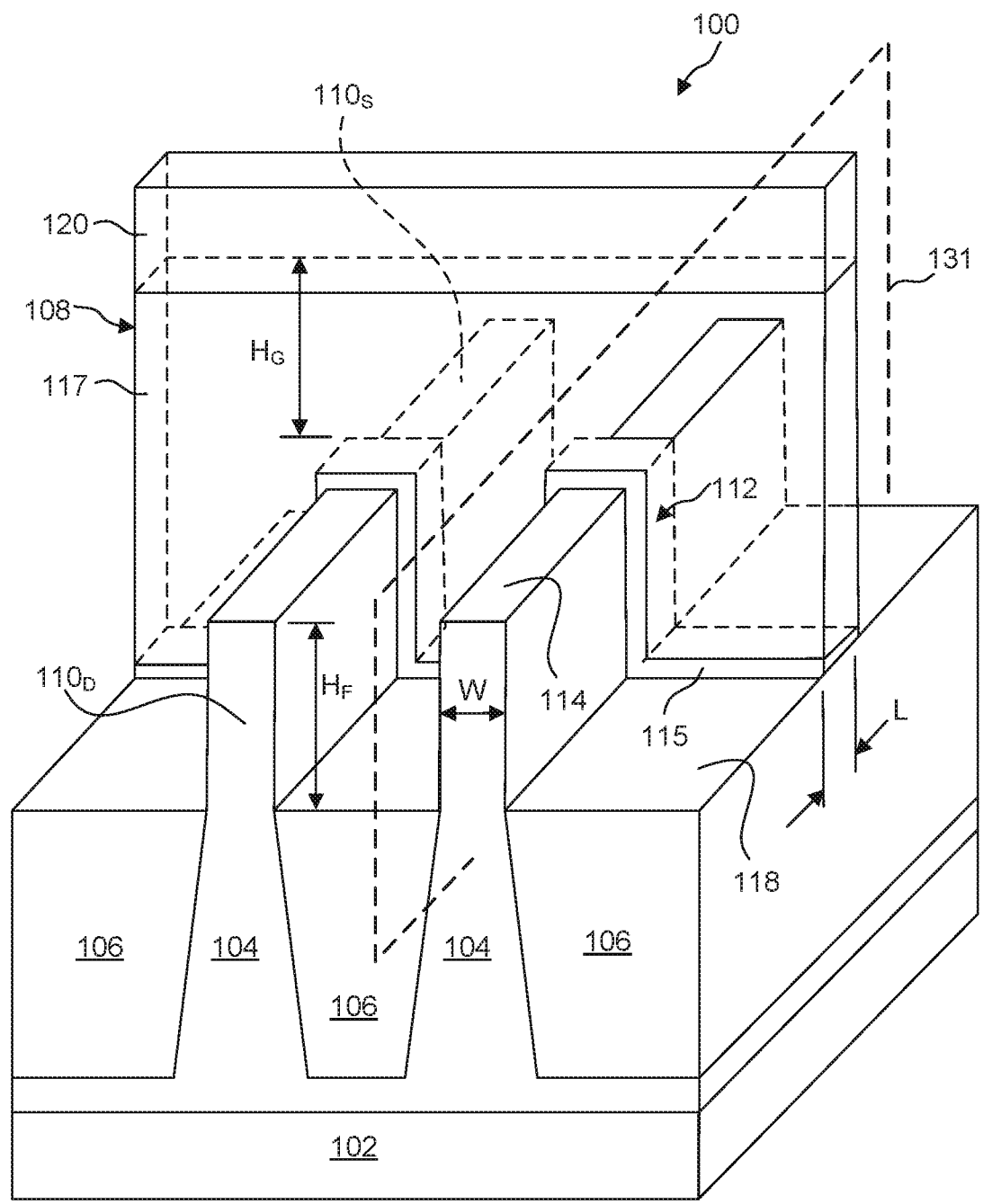
FIG. 1A is an isometric view of an exemplary semiconductor device structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples, This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A very common type of FET is referred to as a metal oxide semiconductor field effect transistor (MOSFET). Historically, MOSFETs have been planar structures built in and on the planar surface of a substrate such as a semiconductor wafer. But recent advances in semiconductor manufacturing have resulted in the use vertical structures.

The term "finFET" refers to a FET that is formed over a fin that is vertically oriented with respect to the planar surface of a wafer.

"S/D" refers to the source and/or drain junctions that form two of the four terminals of a FET.

The expression "epitaxial layer" herein refers to a layer or structure of single crystal material. Likewise, the expression "epitaxially grown" herein refers to a layer or structure of single crystal material. Epitaxialty-grown material may be doped or undoped.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical," as used herein, means nominally perpendicular to the surface of a substrate.

Various embodiments in accordance with this disclosure provide reduced contact resistance compared with conventional processes and semiconductor structures. Specifically, contact resistance may be reduced by incorporating a low contact resistance layer between epitaxial material and silicide contact material in semiconductor devices, such as field-effect transistors (FETs), horizontal gate-all-around (HGAA) structures, and channel-on-oxide (COO) structures. In a fin field-effect transistor (finFET) structure, for example, a heavily-doped low contact resistance layer may be interposed between the epitaxial portions and silicide contact portions of the S/D regions. A lower contact resistance may provide for increased power density which in turn provides for improved transistor performance. By suitably adjusting growth and doping parameters, very high doping levels can be achieved in the low contact resistance layer with minimal diffusion into the underlying semiconductor structure.

Before describing the embodiments related to the design of finFET S/D regions, an example fabrication process for a finFET is presented. FIGS. 1A-2E provide various views of a semiconductor device that includes finFETs during various stages of fabrication. The fabrication process provided here is exemplary, and many other steps may be performed that are not shown in these figures.

Illustrated in FIG. 1A is an isometric view of a semiconductor structure 100. Semiconductor structure 100 includes finFETs. Semiconductor structure 100 includes a substrate 102, a plurality of fins 104, a plurality of isolation structures 106, and a gate structure 108 that is disposed over the sidewalls and top surface of each of fins 104. Fins 104 and isolation structures 106 have top surfaces 114 and 118, respectively. Gate structure 108 includes a gate dielectric structure 115, and a gate electrode structure 117. In alternative embodiments, one or more additional layers or structures may be included in gate structure 108. FIG. 1A shows a hard mask 120 disposed on a top surface of gate electrode layer 117. Hard mask 120 is used to pattern, such as by etching, gate structure 108. In some embodiments, hard mask 120 is made of a dielectric material, such as silicon nitride. The isometric view of FIG. 1A is taken after the patterning process (e.g., etching) of a gate dielectric layer and a gate electrode layer to form gate structure 108. FIG. 1A shows only one gate structure 108. Those skilled in the art will understand that typical integrated circuits contain a plurality of such, and similar, gate structure(s).

Each of the plurality of fins 104 shown in FIG. 1A includes a pair of S/D terminals. For ease of description, a first one of the pair of S/D terminals is referred to as a source region $110_S$ and a second one of the pair of S/D terminals is referred to as a drain region $110_D$, where S/D terminals are formed in, on, and/or surrounding fin 104. A channel region 112 of fin 104 underlies gate structure 108. Gate structure 108 has a gate length L, and a gate width ($2 \times H_F + W$), as shown in FIG. 1A. In some embodiments, the gate length L is in a range from about 10 nm to about 30 nm. In some other embodiments, the gate length L is in a range from about 3 nm to about 10 nm. In some embodiments, the fin width W is in a range from about 6 nm to about 12 nm. In some other embodiments, the fin width W is in a range from about 4 nm to about 6 nm. Gate height $H_G$ of gate structure 108, measured from fin top surface 114 to the top of gate structure 108, is in a range from about 50 nm to about 80 nm, in some embodiments. Fin height $H_F$ of fin 104, measured from the isolation structure top surface 118 to fin top surface 114, is in a range from about 25 nm to about 35 nm, in some embodiments.

Substrate 102 may be a silicon substrate. Alternatively, substrate 102 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, substrate 102 is a semiconductor on insulator (SOI). In another embodiment, substrate 102 may be an epitaxial material.

Isolation structures 106 are made of a dielectric material and may be formed of silicon oxide, spin-on-glass, silicon nitride, silicon oxynitride, fluorine-doped silicate glass (FSG), a low-k dielectric material, and/or other suitable insulating material. Isolation structures 106 may be shallow trench isolation (STI) structures. In an embodiment, the isolation structures are STI structures and are formed by etching trenches in substrate 102. The trenches may then be filled with insulating material, followed by a chemical mechanical polish (CMP) and etch-back. Other fabrication techniques for isolation structures 106 and/or fin 104 are possible. Isolation structures 106 may include a multi-layer structure, for example, having one or more liner layers.

Fins 104 are active regions where one or more transistors are formed. Fin 104 may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof Fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms recesses into isolation structures 106, leaving protruding fins. The recesses may be etched using reactive ion etch (RIE) and/or other suitable processes. Numerous other methods to form fins 104 on substrate 102 may be suitable. Fins 104 may comprise epitaxial material, in accordance with some embodiments.

Gate structure 108 may include a gate dielectric layer 115, a gate electrode layer 117, a spacer layer 111, and/or one or more additional layers. For ease of description, spacer layer 111 is not shown in FIG. 1A. In an embodiment, gate structure 108 uses polysilicon as gate electrode layer 117. Also shown in FIG. 1A is a hard mask 120 disposed on a top surface of gate electrode layer 117. Hard mask 120 is used to pattern, such as by etching, gate structure 108. In some embodiments, hard mask 120 is made of a dielectric material, such as silicon nitride.

Although the isometric view of FIG. 1A shows gate structure 108 using polysilicon as the gate electrode layer 117, those skilled in the art will understand that gate structure 108 may be a sacrificial gate structure such as formed in a replacement gate process used to form a metal gate structure. The replacement gate process and many other steps may be performed and are not shown in these figures. The metal gate structure may include barrier layer(s), gate dielectric layer(s), work function layer(s), fill metal layer(s) and/or other suitable materials for a metal gate structure. In other embodiments, the metal gate structure may further include capping layers, etch stop layers, and/or other suitable materials.

Exemplary p-type work function metals that may be included in the metal gate structure include TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the metal gate structure include Ti, Ag, TaAl, TaAlC, TiAlN, TaC, TaCN, TaSiN, Mn, Zr, other suitable n-type work function materials, or combinations thereof. A work function is associated with the material composition of the work function layer, and thus, the material of the first work function layer is chosen to tune its work function so that a desired threshold voltage $V_t$ is achieved in the device that is to be formed in the respective region. The work function layer(s) may be deposited by CVD, plasma-enhanced vapor deposition (PECVD), ALD, and/or other suitable process. The fill metal layer may include Al, W, or Cu and/or other suitable materials. The fill metal may be formed by CVD, PVD, plating, and/or other suitable processes. The fill metal may be deposited over the work function metal layer(s), thereby filling in the remaining portion of the trenches or openings formed by the removal of the sacrificial gate structure.

Semiconductor device structure 100 described above includes fins 104 and gate structure 108. The semiconductor device structure 100 needs additional processing to form various features, such as lightly-doped-drain (LDD) regions and doped S/D structures, of the transistor utilizing structure 100. LDD regions are formed in fins 104 by doping, and the term LDD regions is used to describe lightly-doped regions disposed between the channel region of a transistor and least one of the transistor's S/D regions. Ion implantation has been used as a doping process for many technology nodes. Embodiments in accordance with the present disclosure are not limited to ion implantation as the doping process for LDD regions.

Figure 1B:
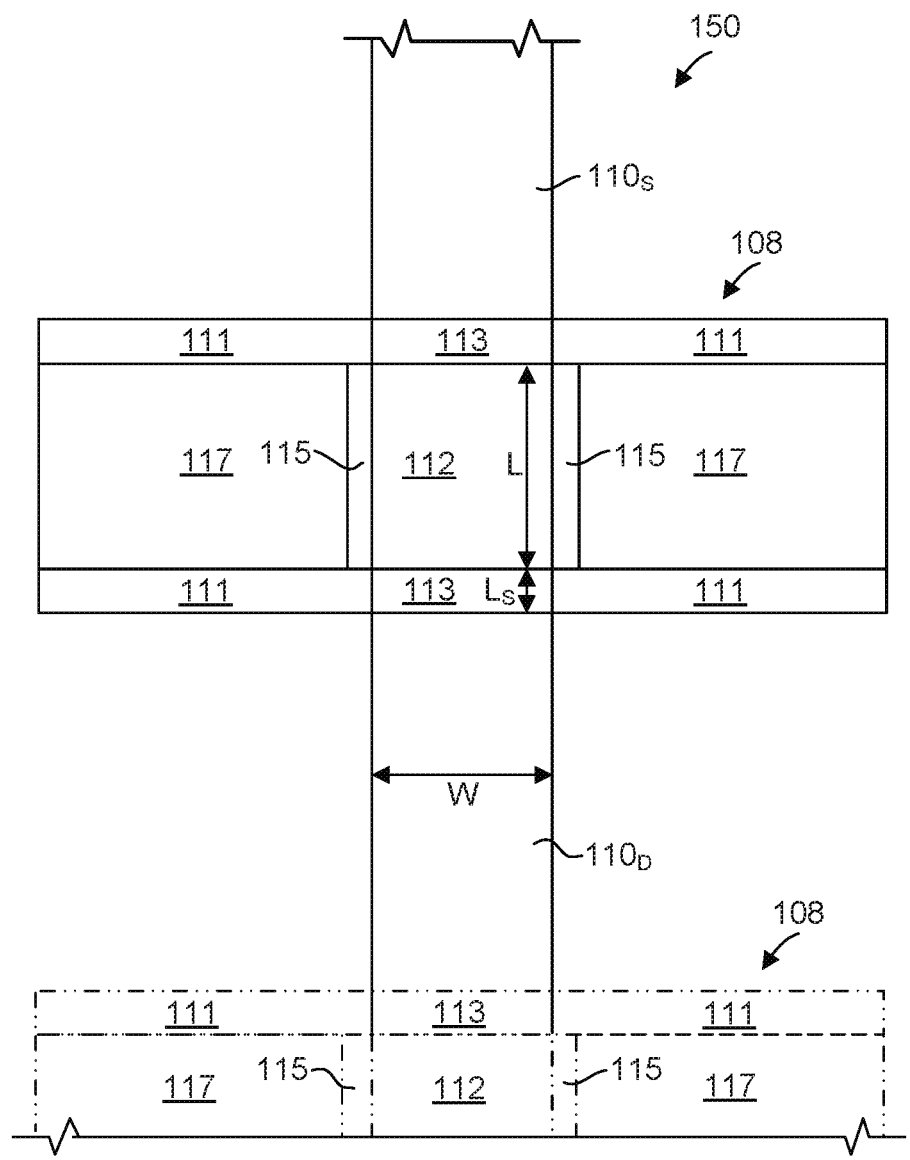
FIG. 1B shows a top view of an exemplary transistor region.

FIG. 1B shows a top view of a transistor region 150 formed with one of the fins 104 of FIG. 1A and taken on a surface level with the top surface 118 of isolation structure 106. Transistor region 150 includes S/D regions $110_S$ and $110_D$. Transistor region 150 also includes a channel region 112, which is part of fin 104 and is surrounded by gate structure 108 on three sides, as shown in FIG. 1A. The channel region 112 underlies the gate structure 108 and has a width (fin width) W. Depending on fabrication processing conditions and device designs, the length of channel region 112 may be slightly different from gate length L. Solely for the ease of description, the length of channel region 112 is denoted as gate length L. Transistor region 150 also includes gate dielectric layer 115 and gate electrode layer 117. FIG. 1B also shows spacers 111 formed on gate structures 108. LDD regions 113 are formed in the top surface and side walls of fin 104. LDD region 113 that is shown in FIG. 1B has a width W and a length $L_S$. FIG. 1B also shows another gate structure 108 by dotted lines. This other gate structure 108 has been described above as being similar and parallel to the gate structure 108 and is not shown in FIG. 1A.

Referring to FIGS. 2A through 2E, various perspective and cross-sectional views of a finFET at various stages of fabrication according to various illustrative embodiments of the present disclosure are shown.

Figure 2A:
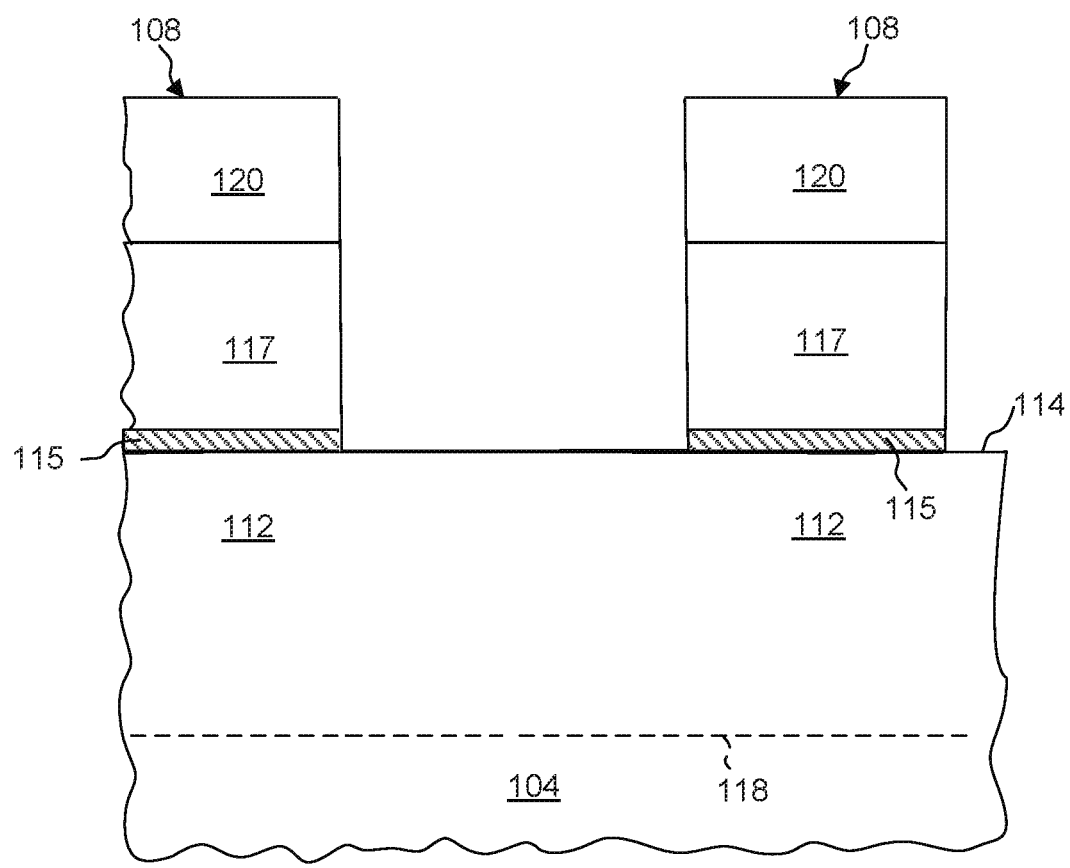
FIGS. 2A-2E show cross-sectional views of a partially fabricated finFET after each of a series processing operations according to this disclosure.

FIG. 2A shows two neighboring gate structures 108 formed over fin 104, taken along the cut 131 shown in FIG. 1A. Each gate structure 108 includes a gate electrode 117 and a gate dielectric 115. A hard mask 120 is disposed over gate electrodes 117, In some embodiments, hard mask 120 is used to define the patterning of gate electrodes 117. Hard mask 120 comprises any suitable material, including but not limited to, silicon nitride, SiON, SiC, SiOC, spin-on glass (SOG), a low-k film, or a silicon oxide. Such silicon oxide may be formed by any suitable method including, but not limited to CVD with tetraethoxysilane (TEOS) as a source gas, plasma enhanced CVD oxide (PE-oxide), high-aspect-ratio-process (HARP) formed oxide. Channel regions 112, which are directly under the gate structures 108 are also noted in FIG. 2A. A dotted line 118 indicates the level of surfaces of isolation regions 106.

Figure 2B:
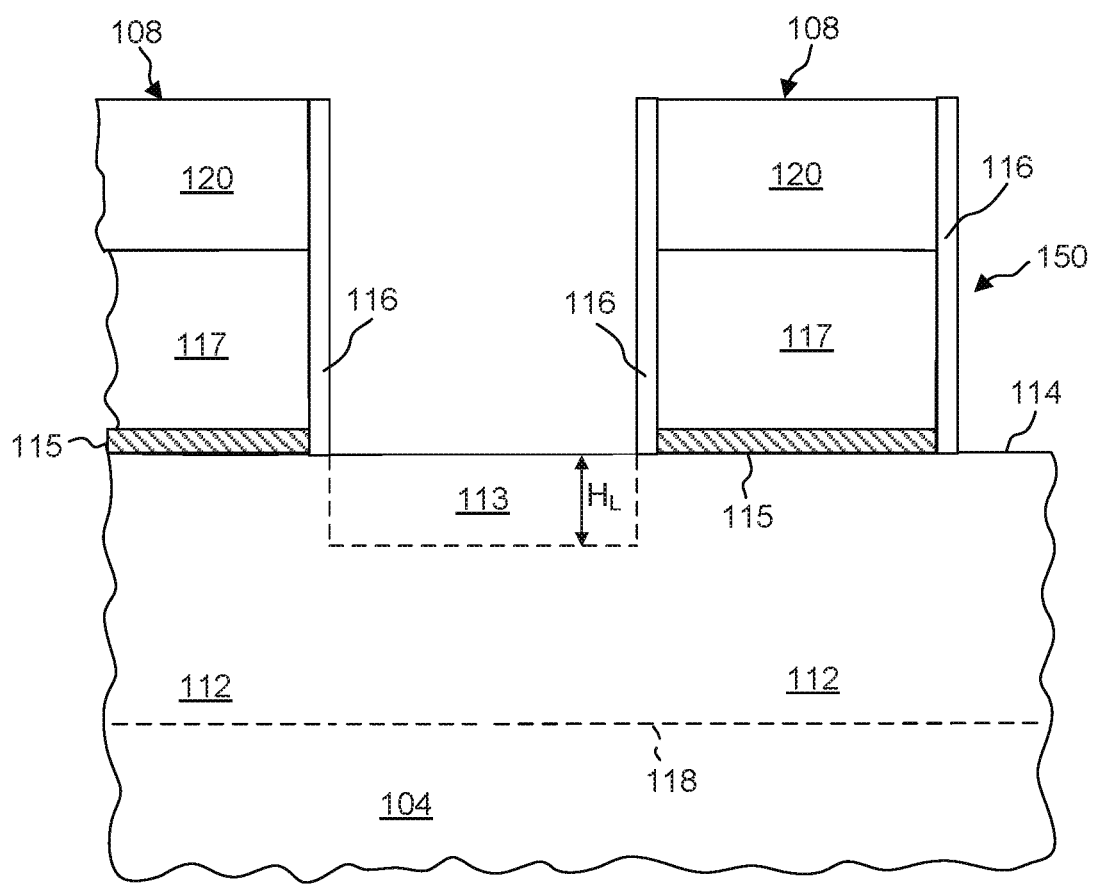

FIG. 2B shows an offset spacer 116 used to expose a portion of the channel region—i.e., LDD regions 113—to LDD ion implantation while blocking the ion implantation from a portion of the channel region immediately next to the sidewalk of the gate electrode structures 117. Offset spacers 116 are formed using an etch-back technique. For example, to form offset spacer 116, a blanket offset spacer layer is first deposited over the substrate, including gate structures 108 which have a hard mask layer 120 over the structures. An etch-back process is then used to remove portions of the blanket offset spacer layer to expose a portion of the channel region for ion implantation. The remaining blanket offset spacer layer forms offset spacers 116 at least on the sidewalls of gate electrode structures 117 and hardmask layer 120. Offset spacer 116 is made of a dielectric material, such as silicon oxide, SiON, or silicon nitride (SiN). In some embodiments, the deposition process is a plasma-enhanced chemical vapor deposition (PECVD) process. Other applicable deposition processes may also be used. In some embodiments, the thickness of offset spacer 116 is in a range from about 2 nm to about 4 nm. Offset spacer 116 provides an offset distance, which is the thickness of offset spacer 116, from channel region 112 and prevents the dopants from being implanted in the channel region 112.

LDD regions 113 are then formed in the fin structure between adjacent offset spacers 116 using any suitable processes. For example, an ion implant process is performed to form LDD regions 113, and may utilize any suitable doping species. Although LDD regions 113 are shown as only being close to the top surface of fin 104, LDD regions 113 may actually be close to both the top surface and sidewalk of fin 104. The LDD implantation may be performed vertically, or tilted toward the sidewalls of fin 104. Depending on the implantation process, LDD regions 113 may extend to a certain depth below the surfaces of fin 104. For example, LDD region 113 may extend to a depth of $H_L$ below the top surface of fin 104, as shown in FIG. 2B. It will be understood by those skilled in the art that the region may also extend from the sidewall surfaces of fin 104 into the interior of fin 104. Substrate 102 could have both p-type and n-type devices. Additional processes, such as lithography patterning processes, would be involved to protect the p-type device regions from dopant ions for n-type devices. The processing sequence involved in forming and doping the p-type devices are well known to those of ordinary skill in the art and are not further described in this disclosure.

After the dopant ions are implanted, a thermal anneal is performed to drive in and to activate the dopants. The thermal anneal may utilize rapid thermal processing (RTP) anneal, spike anneal, millisecond anneal, or laser anneal. Spike anneal operates at peak anneal temperature for a time period on the order of seconds. Millisecond anneal operates at peak anneal temperature for a time period on the order of milliseconds, and laser anneal operates at peak anneal temperature for a time period on the order of nanoseconds to microseconds.

Figure 2C:
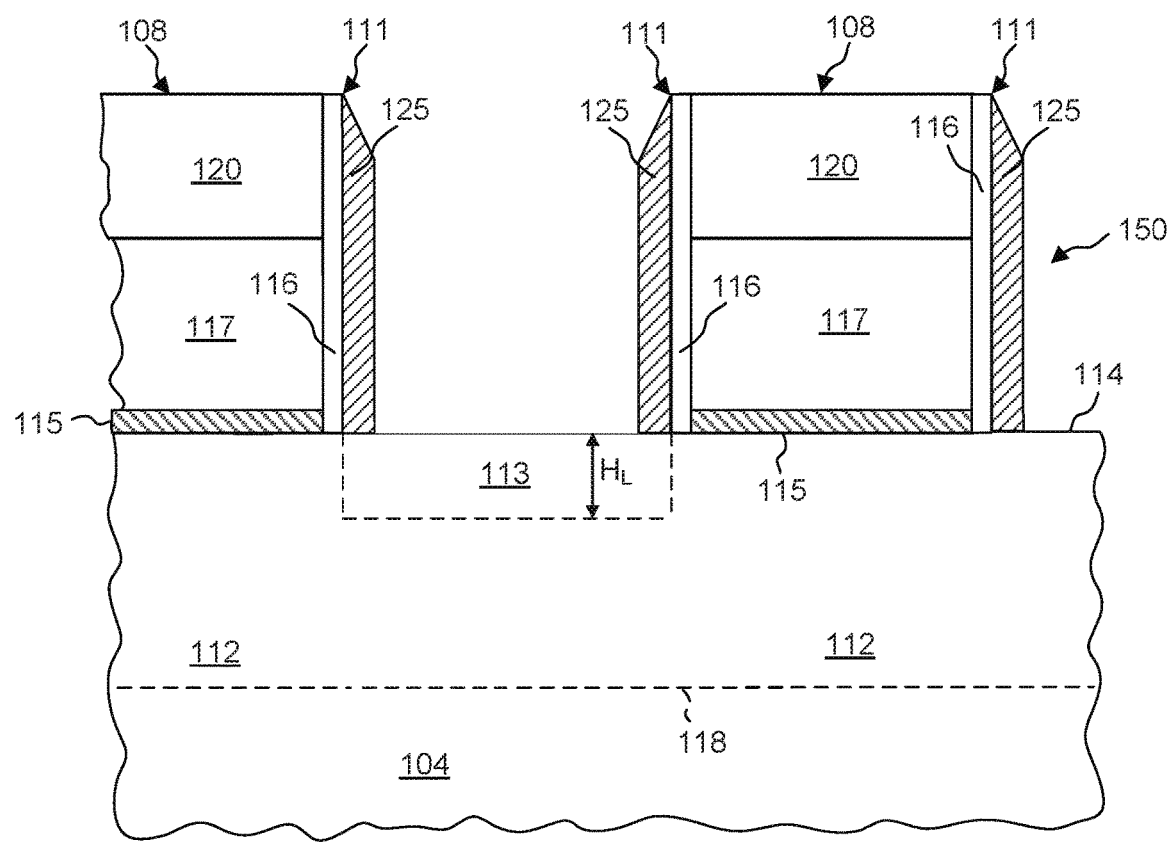

FIG. 2C shows main spacers 125 formed over transistor region 150, taken along the cut 131 shown in FIG. 1A. Main spacers 125 cover offset spacers 116, and may also cover a top surface of gate structure 108 (not shown in FIG. 2C). The thickness of main spacer 125 is in a range from about 5 nm to about 10 nm, which is sufficient to protect gate structure 108 and offset spacers 116 during subsequent etching of fin 104. Main spacers 125 are formed using an etch-back technique. For example, to form main spacer 125, a blanket main spacer layer is first deposited over the substrate, including gate structures 108 which have a hard mask layer 120 over the structures. An etch-back process is then used to remove portions of the blanket main spacer layer to form an opening and expose a portion of LDD region 113 for the subsequent fin etching process. The remaining blanket main spacer layer forms main spacers 125. Main spacer 125 is made of a dielectric material, such as SiON, silicon nitride (SiN), or carbon-doped silicon nitride (SiCN). SiCN has relatively low etch rate against etchants, such as $H_3PO_4$ and HF, in comparison to SiN or SiON. In some embodiments, the deposition process is PECVD. Other applicable deposition processes may also be used. In some embodiments, each offset spacer 116 has a width in a range from about 5 nm to about 10 nm. A material removal process can be performed to remove main spacer 125 that has been formed over hard mask layer 120 and also over other portions of surfaces on substrate 102, for example, RIE processes and/or other suitable processes. Taken together, offset spacers 116 and main spacers 125, are referred to as spacers 111.

Figure 2D:
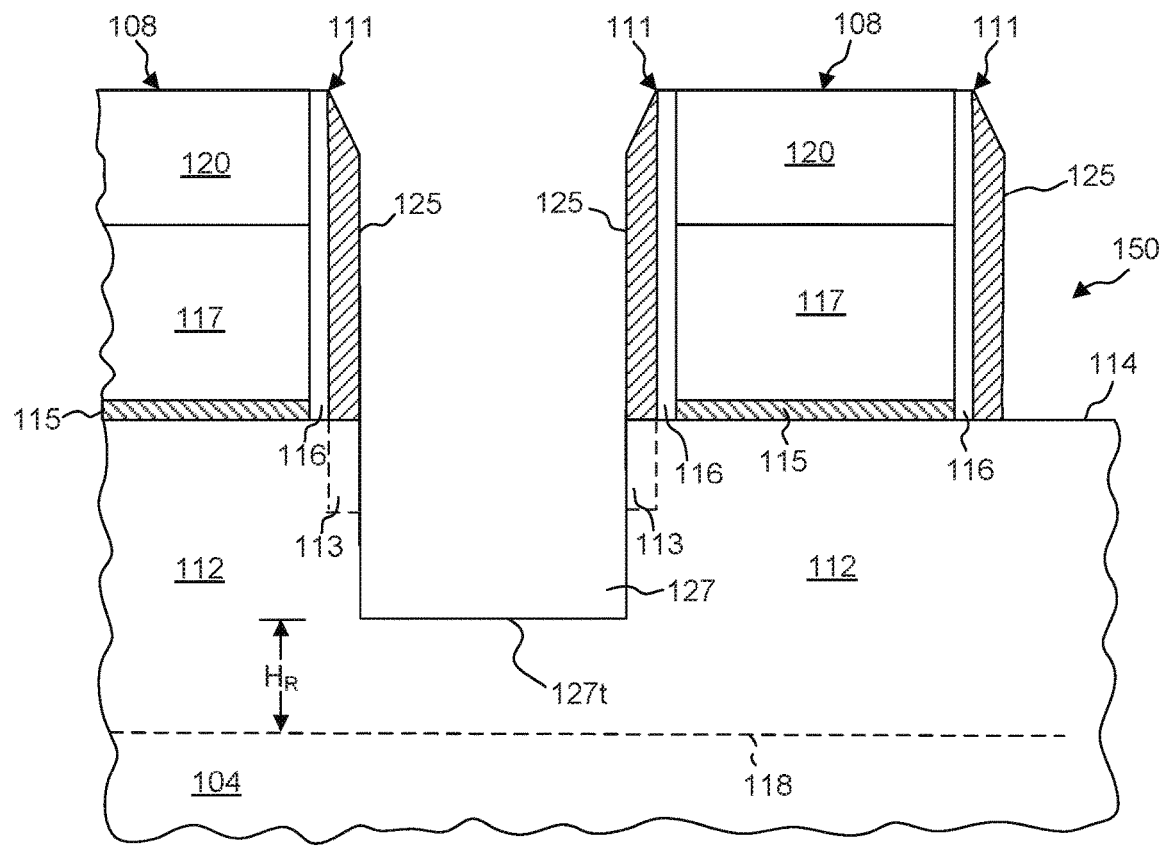

FIG. 2D shows recess 127 formed in the fin between neighboring gate structures 108, taken along the cut 131 shown in FIG. 1A. Exposed portion of fin 104 is etched using RIE processes and/or other suitable processes. An illustrative fin etching process may be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. Also, the bias voltage used in the illustrative etching process may be tuned to allow better control of an etching direction to achieve desired profiles for recess 127. In some embodiments, recess 127 may be formed to have either an angular or rounded shape at its bottom. Recess 127 has bottom surface 127t. As shown in FIG. 2D, bottom surface 127t is above the flat top surfaces 118 of isolation structure 106. In another embodiment, bottom surface 127t is below the flat top surfaces 118 of isolation structures 106. Spacers 111 and hard mask 120 are used as hard masks such that recess 127 is self-aligned with the opening formed by opposing spacers 111. Height $H_R$ measured from bottom surface 127t to isolation structure top surface 118 may be adjusted by the manufacturer. Recesses 127 may be formed to have either an angular or rounded shape at their bottoms.

Figure 2E:
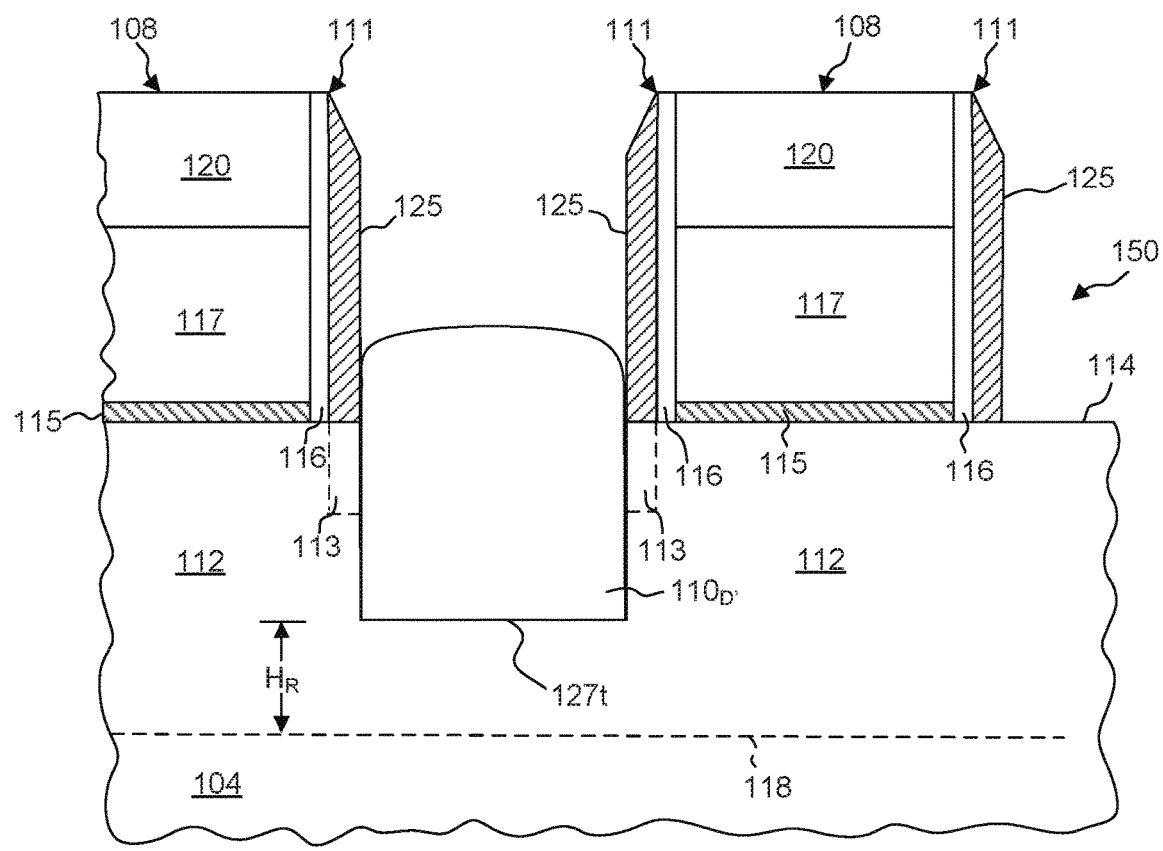

FIG. 2E shows that after recess 127 is formed, an epitaxial material is grown in recess 127 to form epitaxial doped S/D regions, $110_D'$ and $110_S'$ respectively. For ease of description, a first one of the pair of doped epitaxial S/D terminals is referred to as a source region $110_S'$ and a second one of the pair of doped S/D terminals is referred to as a drain region $110_D'$. In some embodiments the dopants in doped S/D regions $110_D'$ and $110_S'$, diffuse into LDD regions 113 during annealing. FIG. 2E shows that epitaxial material is grown in recess 127 to form doped drain regions $110_D'$, and for ease of description, doped source region $110_S'$ is not shown in FIG. 2E. At least a portion of each doped S/D region $110_D'$ and $110_S'$ is formed in recesses 127, and therefore is also self-aligned with the opening defined by opposing spacers 111.

In some embodiments, the epitaxial material filling recesses 127 to form doped S/D regions, $110_D'$ and $110_S'$, is a silicon-based material. In some embodiments, the epitaxially-grown silicon-based material is formed by an epitaxial deposition/partial etch process, which repeats the epitaxial deposition/partial etch process at least once. Such repeated deposition/partial etch process is also called a cyclic deposition-deposition-etch (CDDE) process. The deposition process forms a thin epitaxial layer of silicon-based material in recess 127 and an amorphous silicon-based material on non-crystalline surfaces. An etching (or partial etching) process removes the amorphous silicon-based material and also a portion of the silicon-based material in recesses 127. As a result of the process, silicon-based material is deposited in each of recesses 127 to form epitaxial S/D regions $110_D'$ and $110_S'$, respectively.

Still referring to formation of doped S/D regions, $110_D'$ and $110_S'$, in-situ doping processes may also be incorporated during or after the deposition of silicon-based material. For example, an n-type doping precursor, e.g., phosphine ($PH_3$) and/or other n-type doping precursors, can be used during the formation of the S/D regions of an n-type transistor. By using the in-situ doping process, the dopant concentration of silicon-based material can be desirably controlled. In some embodiments, silicon-based material can be an n-type doped silicon layer that is doped with phosphorus (Si:P). In some embodiments, silicon-based material can be an n-type doped silicon layer that is doped with both phosphorus and carbon (Si:CP). Carbon could impede the out-diffusion of phosphorus from silicon-based material. In some embodiments, silicon-based material can be an n-type doped silicon layer that is doped with arsenic. Other types of dopants may also be included. In some embodiments, the phosphorus dopant concentration is in a range from about $7 \times 10^{20}$ atoms/$cm^3$ to about $3 \times 10^{21}$ atoms/$cm^3$. In some embodiments, the carbon dopant concentration is in a range from about 0.1% to about 5% (atomic percent). In some embodiments, silicon-based material can be a p-type doped silicon layer that is doped with boron. Other types of dopants for forming a p-type doped silicon layer may also be used, for example, gallium or indium. Those skilled in the art will recognize that an embodiment illustrating a type of doping (e.g., n-type) is generally applicable to use of an opposite type of doping (e.g., p-type). In alternative embodiments a p-type doped SiCie layer may be epitaxially grown to form the S/D regions.

In some embodiments, silicon-based material can be formed by CVD, e.g., low pressure CVD (LPCVD), atomic layer CVD (ALCVD), ultrahigh vacuum CVD (UHVCVD), PECVD, remote plasma. CVD (RPCVD), any suitable CVD; molecular beam epitaxy processes; any suitable epitaxial process; or any combinations thereof.

In some embodiments, the etching process can use an etching gas including at least one of hydrogen chloride (HCl), chlorine ($Cl_2$), other suitable etching gases, and/or any combinations thereof. The etching process would remove the amorphous silicon-based material over non-crystalline surface at a rate higher than the removal rate of epitaxial silicon-based material. Therefore, only epitaxial film remains on the substrate surface after a CDDE cycle. The epitaxial deposition/partial etch process is repeated a number of times until a desired thickness is reached.

Figure 3A:
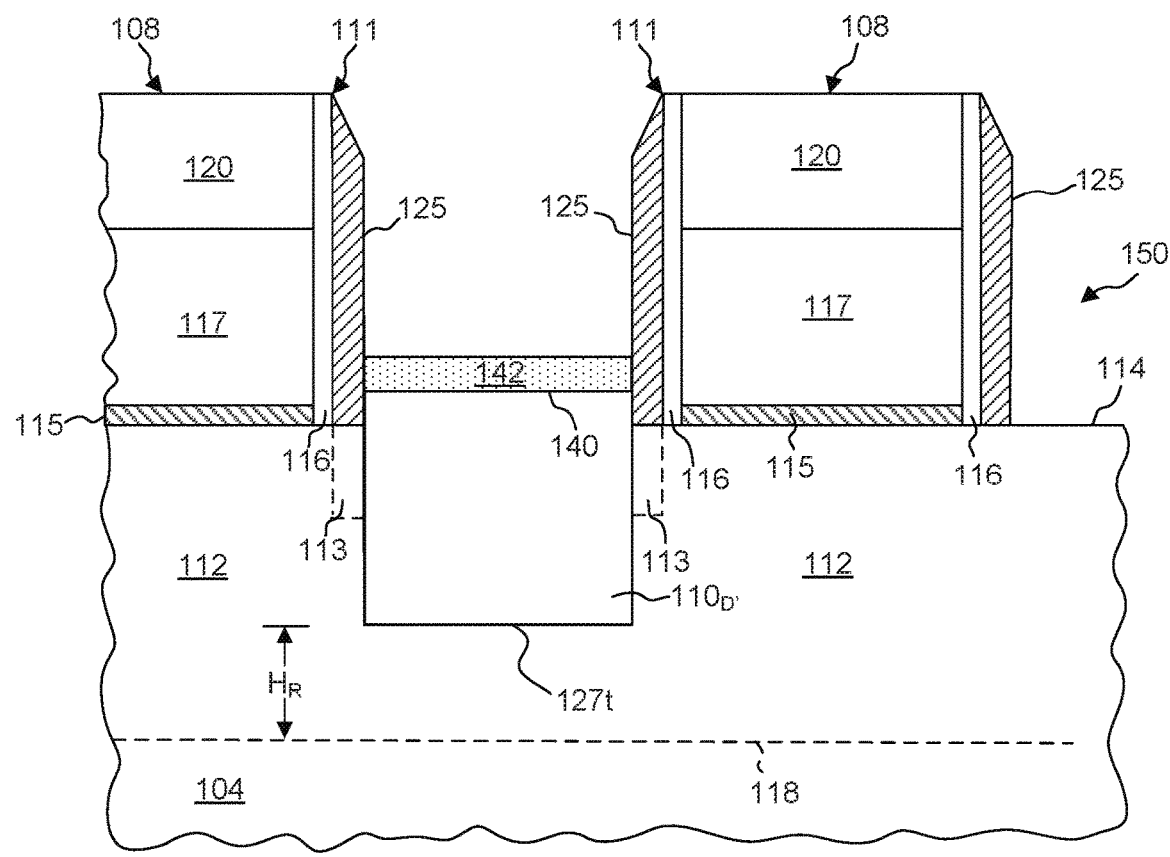
FIGS. 3A-3B show cross-sectional views of a partially fabricated finFET after each of a series of processing operations for forming a heavily-doped crystalline layer over source/drain (S/D) regions according to this disclosure.
Figure 3B:
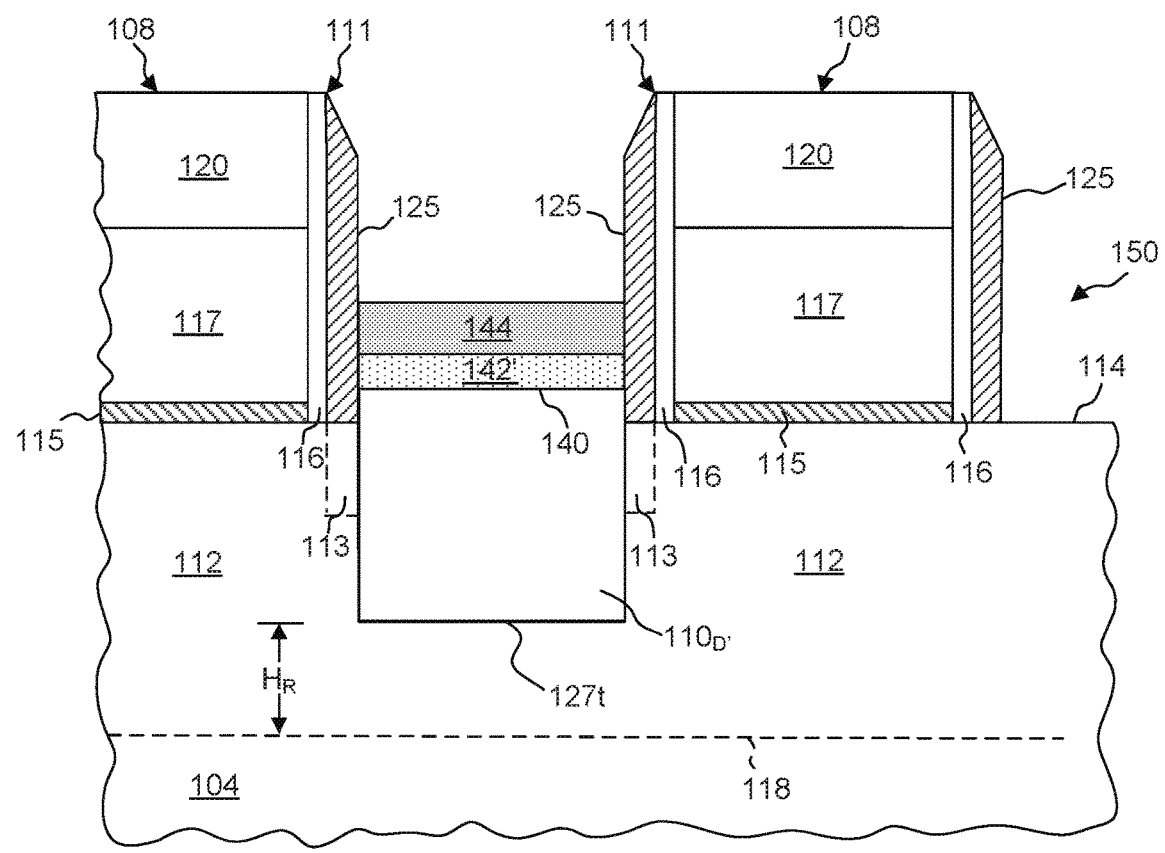

Referring to FIGS. 3A and 3B, various exemplary structures resulting from fabrication operations for forming S/D contact structures having low contact resistance are shown.

In FIG. 3A, a top portion of doped drain region $110_D'$ is removed to form a drain region top surface 140, according to the cut 131 illustrated in FIG. 1A. For ease of description, doped source region $110_S'$ is not shown in FIG. 3A or 3B. Drain region top surface 140 may be a planar surface in parallel with fin top surface 114. Drain region top surface 140 may additionally comprise sidewall portions that are not in parallel with fin top surface 114, which are not shown in FIG. 3A or 3B. For example, drain region top surface 140 may comprise portions that are perpendicular to fin top surface 114. The top portion of drain region $110_2'$ may be removed using suitable processes including photolithography and etch processes. The photolithography process may include forming a photoresist layer (resist) overlying the substrate (e.g., a finFET structure), exposing the resist to a pattern, performing post-exposure bake processes, and developing the resist to form a masking element including the resist. The masking element may then be used to protect regions of the substrate while an etch process removes a least a portion of doped S/D regions $110_D'$ and $110_S'$. The etch process may be RIE, and/or other suitable processes. Numerous other methods to etch doped S/D regions $110_D'$ and $110_S'$ may be suitable. As shown in FIG. 3A, drain region top surface 140 is above the fin top surface 114. In another embodiment, drain region top surface 140 is below the fin top surface 114.

In various exemplary embodiments, an amorphous layer 142 is formed over doped drain region $110_D'$ by a fabrication operation such as a deposition or a growth process. Amorphous layer 142 includes a semiconductor material or a semiconductor alloy material, and may be, specifically, an amorphous germanium layer, an amorphous silicon layer, an amorphous SiGe layer, or another amorphous semiconductor or semiconductor alloy layer. Although the example of FIG. 3A depicts amorphous layer 142 being formed over doped drain region $110_D'$, in alternative embodiments, amorphous layer 142 is formed over other regions of substrate 102. In some embodiments, semiconductor material can be formed by CVD, e.g., LPCVD, ALCVD, UHVCVD, PECVD, RPCVD, any suitable CVD; any suitable deposition process; or any combinations thereof. The thickness of amorphous layer 142 is controlled by the deposition process.

An ion implantation is performed on amorphous layer 142, and may utilize any suitable doping species. In-situ doping processes may also be incorporated into the deposition process of amorphous layer 142. For example, an n-type doping precursor, e.g., phosphine ($PH_3$) and/or other n-type doping precursors, can be used during the formation of n-type S/D regions for an n-type FET. By using the in-situ doping process, the dopant concentration of silicon-based material can be desirably controlled and achieved. For example, amorphous layer 142 can be an n-type heavily-doped silicon layer that is doped with phosphorus (Si:P). In some embodiments, amorphous layer 142 can be an n-type doped silicon layer that is doped with arsenic. Other types of dopants for forming n-type doped silicon layer may also be included. In some embodiments, the phosphorus dopant has a concentration in a range from about $5 \times 10^{20}$ atoms/cm$^3$ to at least about $7 \times 10^{21}$ atoms/cm$^3$. Amorphous layer 142 may also be a p-type heavily-doped silicon layer. For example, amorphous layer 142 may be heavily doped with boron. Other types of dopants for forming p-type doped silicon layer may also be included, for example, gallium or indium.

FIG. 3B shows the structure of FIG. 3A after a crystallization process is performed on at least a portion of amorphous layer 142. In this exemplary embodiment, the crystallization process converts amorphous layer 142 to a crystalline layer by using the crystalline semiconductor structure of epitaxial doped drain region $110_D'$ as a crystal template, An example method of crystallizing a layer of amorphous semiconductor material is a solid-phase epitaxial (SPE) regrowth process. The SPE regrowth process includes an annealing process and uses the crystalline semiconductor structure of a seed layer as a crystal template to crystallize an amorphous semiconductor layer. The SPE regrowth may begin at an interface between the seed layer and the amorphous layer and proceed through an entirety of a thickness of the amorphous layer. The SPE regrowth may cause an entirety of the amorphous layer to become a single-crystal semiconductor layer. In this exemplary embodiment, the annealing process may enable SPE regrowth to occur in amorphous layer 142, starting from the interface of amorphous layer 142 and drain region top surface 140. The SPE regrowth may use the crystalline semiconductor structure of epitaxial doped drain region $110_D'$ as a crystal seed layer in crystallizing amorphous layer 142. As a result, the SPE regrowth crystallizes amorphous layer 142. In some embodiments, amorphous layer 142 is doped with impurities to facilitate or accelerate the SPE regrowth. In other embodiments, the annealing and crystallization processes may be performed multiple times to achieve desired results.

In some embodiments, the annealing process utilizes a temperature low enough to prevent damage to the structure or to devices formed in the structure. In one example, amorphous layer 142 includes an amorphous germanium layer and epitaxial doped drain region $110_D'$ includes a crystalline germanium region, and an annealing temperature for the solid-phase epitaxial regrowth is within a range of approximately 400 to 600° C. In another example, amorphous layer 142 includes an amorphous silicon layer and epitaxial doped drain region $110_D'$ includes a crystalline silicon region, and an annealing temperature for the SPE regrowth is under 600° C. In another example, amorphous layer 142 includes an amorphous SiGe layer, and an annealing temperature for the SPE regrowth is in a range of 500-550° C. As a result of the SPE regrowth, amorphous layer 142 is converted to heavily-doped epitaxial layer 142'.

Because the SPE regrowth allows heavily-doped epitaxial layer 142' to take on the crystal orientation of a seed layer, a variety of different crystal orientations can be achieved for heavily-doped epitaxial layer 142'. As described above, amorphous layer 142 may be comprised of various semiconductor materials and semiconductor alloy materials. For example, the doped epitaxial source region $110_D'$ may be comprised of crystalline silicon and may be of various different crystal orientations, e.g., having a (100), (110), or (111) crystal orientation. The regrowth may cause amorphous layer 142 to take on the crystal orientation of the doped source region $110_D'$.

The SPE regrowth may also allow amorphous layer 142 and doped source region $110_D'$ to be different materials. For example, a doped epitaxial drain region $110_D'$ of SiGe may be used to crystallize amorphous layer 142 comprising of either amorphous silicon or amorphous germanium material. Specifically, when using doped epitaxial drain region $110_D'$ of SiGe as a seed layer, crystallizing an amorphous silicon layer or an amorphous germanium layer may cause stress or strain in the resulting crystalline silicon layer or crystalline germanium layer. For example, heavily-doped epitaxial layer 142' of silicon formed using SiGe as seed layer may be under tensile stress, where the tensile stress may increase electron mobility in the heavily-doped epitaxial layer 142'. As another example, heavily-doped epitaxial layer 142' of germanium formed using SiGe as seed layer may be under compressive stress, where the compressive stress may increase hole mobility in heavily-doped epitaxial layer 142'. Various other combinations of seed layer and amorphous layer materials may be selected such that the resulting heavily-doped epitaxial layer 142' may have a level of stress or strain.

The portions of amorphous layer 142 that are formed on areas of the substrate other than the doped S/D regions $110_S'$ and $110_D'$ remain amorphous SPE regrowth, since they are not in contact with a crystalline seed layer. The remaining amorphous material is then selectively removed through an etching process, for example, an RIE process, a chemical etching process (e.g., an $HNO_3$:HF dilute solution), and/or other suitable processes. Amorphous material etches much more rapidly than crystallized material, therefore sufficient etch selectivity can be obtained to selectively remove the remaining amorphous material. Depending on the device design and specific needs of the semiconductor structure, the thickness of heavily-doped epitaxial layer 142' may be in a range of 1-7 nm.

A contact layer 144 may then be formed upon heavily-doped epitaxial layer 142' of S/D regions $110_S$' and $110_D$'. Contact layer 144 may be formed by a self-aligned silicide (salicide) process. A salicide process involves deposition of, for example, a transition metal to form a thin layer by a suitable process such as CVD, application of heat to allow the transition metal to sinter with exposed material in the active regions (source and drain), for example, heavily-doped epitaxial layer 142', to form a low-resistance transition metal silicide. Typical transition metal may include nickel, cobalt, tungsten, tantalum, titanium, platinum, erbium, palladium, or combinations thereof. Contact layer 144 may include silicide materials, such as nickel silicide (NiSi, $NiSi_2$), nickel-platinum silicide (NiPtSi), nickel-platinum-germanium silicide (NiPtGeSi), nickel-germanium silicide (NiGeSi), ytterbium silicide (YbSi), platinum silicide (PtSi), erbium silicide (ErSi), cobalt silicide ($CoSi_2$), titanium silicide ($TiSi_2$), tantalum silicide ($TaSi_2$), other suitable conductive materials, and/or combinations thereof. Any remaining transition metal may be removed by chemical etching, leaving silicide contacts only in the active regions. S/D contact plugs (not shown) may be further formed over the silicide material in subsequent process steps. In some embodiments, contact plugs comprise tungsten. In alternative embodiments, contact plugs comprise other metal or metal alloys such as aluminum, copper, titanium nitride (TiN), or the like. Contact plugs can be formed using appropriate deposition and etching methods.

Heavily-doped epitaxial layer 142' reduces the contact resistance at least by enhancing the tunneling effect of charge carriers in S/D regions. In accordance with this disclosure, a desired amount of contact resistance can be achieved by suitably adjusting parameters of heavily-doped epitaxial layer 142'. In some embodiments, the contact resistance can be reduced at least by adjusting the doping level of heavily-doped epitaxial layer 142', for example, a higher doping level will result in a lower contact resistance. In some embodiments, the contact resistance can be reduced by enlarging the contact area between heavily-doped epitaxial layer 142' with the S/D regions of transistor region 150. In some embodiments, the contact resistance can be reduced by increasing the thickness of heavily-doped epitaxial layer 142'.

Subsequent processing may further form various contacts/vias/lines and multilayer interconnect features (e.g., metal layers and interlayer dielectrics) over substrate 102, configured to connect various features or structures. The additional features may provide electrical interconnection to the device. For example, a multilayer interconnection includes vias and horizontal interconnects, such as metal lines. The various interconnection features may be formed from various conductive materials including, but not limited to, copper, and tungsten. In some embodiments, a damascene and/or dual damascene process is used to form a conductive multilayer interconnection structure.

One benefit of the heavily-doped contact layer in semiconductor structures in accordance with this disclosure is that the contact resistance can be reduced compared to other contact structures. Another benefit of the heavily-doped contact layer in accordance with this disclosure is that both n-type and p-type doping can be achieved with very high doping levels in the contact layer and minimal diffusion into the underlying material. The heavily-doped contact layer may also leave a minimal footprint in the semiconductor structure since the layer thickness can be precisely controlled by the SPE process and can be reduced to only a few nanometers. There may be no changes in layout design rules since the heavily-doped contact is self-aligned to the S/D regions. Further, layout design rules for incorporating a heavily-doped contact layer between S/D regions and the silicide contact layer in n-channel finFET S/D structures are the same as the layout design rules for p-channel finFET S/D structures.

Figure 4A:
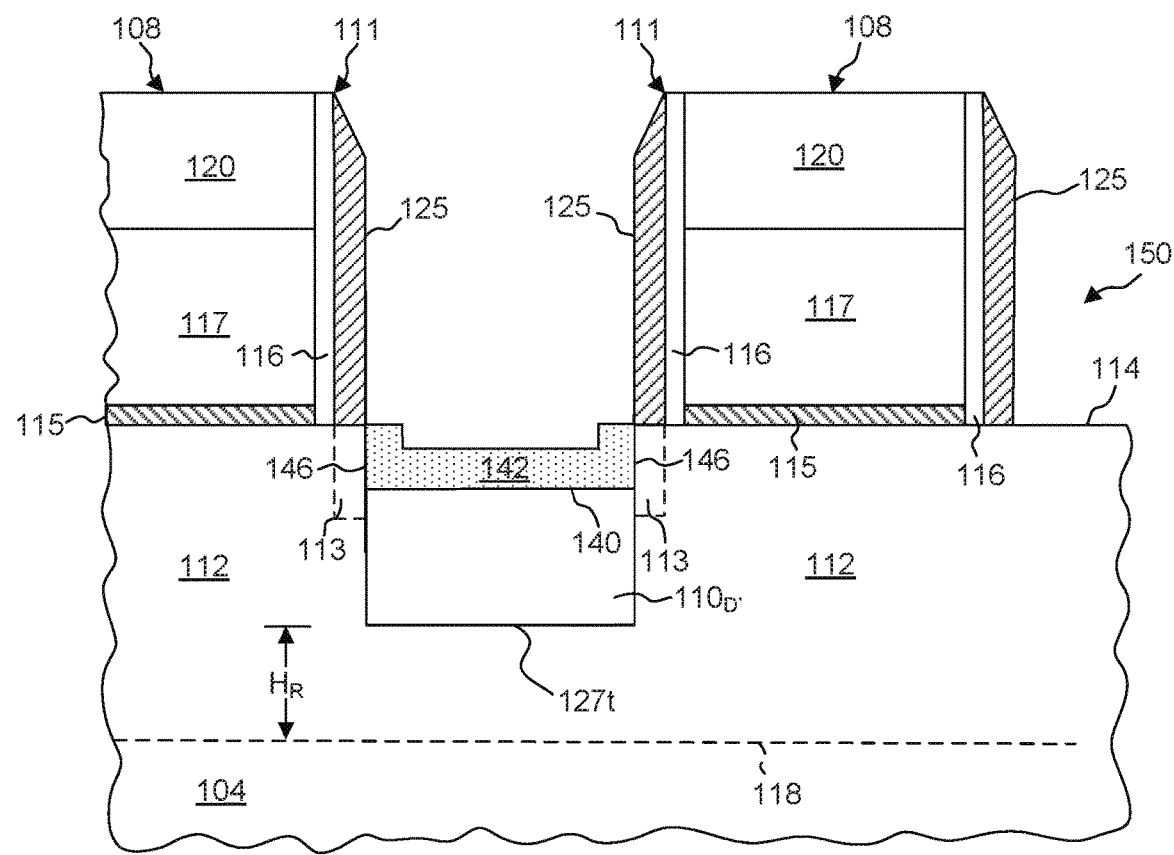
FIGS. 4A-4B show cross-sectional views of a partially fabricated finFET after each of a series of processing operations for forming a heavily-doped crystalline layer over S/D regions and fin sidewalls of an example transistor region, according to this disclosure.
Figure 4B:
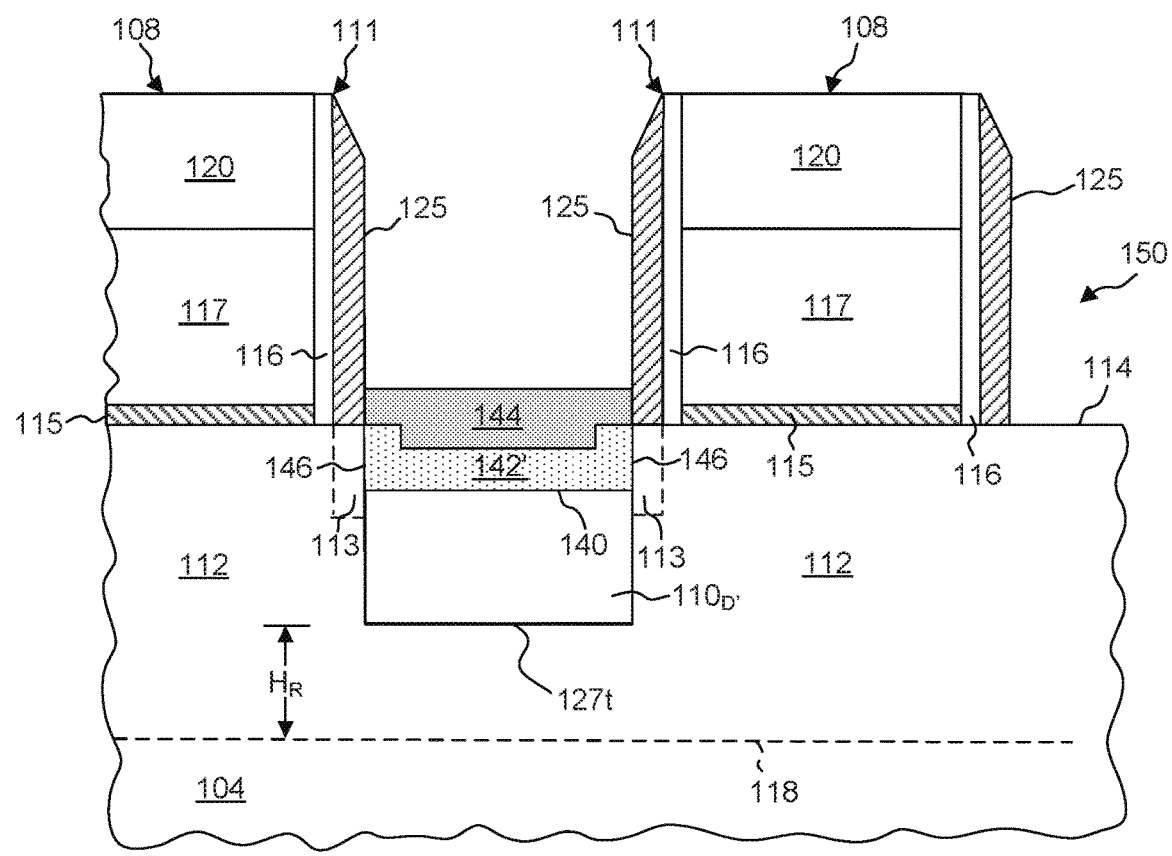

Referring to FIGS. 4A and 4B, various exemplary structures resulting from fabrication operations for forming S/D contact structures having low contact resistance are shown.

In FIG. 4A, similar to the process described above in connection with FIG. 3A, a top portion of doped drain region $110_D$' is removed to form a drain region top surface 140. For ease of description, doped source region $110_S$' is not shown in FIG. 4A or 4B. Drain region top surface 140 may be a planar surface in parallel with fin top surface 114. Drain region top surface 140 may additionally comprise sidewall portions. For example, drain region top surface 140 may comprise portions that are perpendicular to fin top surface 114. The top portion of drain region $110_D$' may be removed using suitable processes including photolithography and etch processes. However, as shown in FIG. 4A, drain region top surface 140 is etched to a level that is below the fin top surface 114, and a fin sidewall portion 146 of fin 104 is exposed as a result of the etching process. Furthermore, a desired height difference between drain region top surface 140 and fin top surface 114, as well as a desired amount of exposed fin sidewall portion 146 can be achieved at least through adjusting etching parameters and conditions.

Similar to the process described above in connection with FIG. 3A, an amorphous layer 142 may be formed over doped drain region $110_D$' by a deposition or growth process, and may further be doped by an ion implant process. Amorphous layer 142 may include a semiconductor material or a semiconductor alloy material, such as but not limited to, an amorphous germanium layer, an amorphous silicon layer, an amorphous SiGe layer, or another amorphous semiconductor or semiconductor alloy layer. FIG. 4A depicts amorphous layer 142 disposed over drain region top surface 140. And since fin portions 146 are also exposed, amorphous layer 142 is also deposited on fin sidewall portion 146. Similar to the process described with reference to FIG. 3A, amorphous layer 142 may also be formed over other regions of substrate 102.

In FIG. 4B, similar to the process described above with reference to FIG. 3B, annealing is used to crystallize amorphous layer 142 using the crystalline semiconductor structure of the epitaxial doped drain region $110_D$' as a crystal template. If fin 104 comprises crystalline semiconductor material, the portions of amorphous layer 142 that are in contact with fin sidewall portions 146 will also be crystallized using the crystalline semiconductor structure of fin sidewall portion 146 as a crystal template. The annealing may enable an SPE regrowth to occur in amorphous layer 142, starting from the interface of amorphous layer 142 and drain region top surface 140, and also from the interface of amorphous layer 142 and fin sidewall portion 146. The SPE regrowth uses the crystalline semiconductor structure of epitaxial doped drain region $110_D$' and fin sidewall portion 146 as crystal orientation templates in crystallizing amorphous layer 142. As a result, the SPE regrowth crystallizes amorphous layer 142 in accordance with the crystal orientation of drain region $110_D$' and fin sidewall portion 146. In some embodiments, amorphous layer 142 is doped with impurities to facilitate or accelerate the SPE regrowth. In other embodiments, the annealing and crystallization process may be performed multiple times to achieve desired results. In various embodiments, the annealing process utilizes a temperature low enough to prevent damage to the structure or to devices formed in the structure. As a result of the SPE regrowth, amorphous layer 142 is converted to heavily-doped epitaxial layer 142'.

As described above, the SPE regrowth provides heavily-doped epitaxial layer 142' to take on the crystal orientation of drain region $110_D'$ and fin sidewall portion 146. The SPE regrowth allows amorphous layer 142 and doped source region $110_D'$ to be different materials. The portions of amorphous layer 142 that are formed on areas of the substrate other than doped S/D regions $110_S'$ and $110_D'$ remain amorphous during the SPE regrowth, since they are not in contact with a crystalline orientation template. The uncrystallized amorphous material is then selectively removed through an etching process.

Contact layer 144 may then be formed upon heavily-doped epitaxial layer 142' of S/D regions $110_S'$ and $110_D'$. Contact layer 144 may be formed by a salicide process. For example, deposition of a transition metal to form a thin layer by a suitable process such as CVD, application of heat to allow the transition metal to sinter with exposed material in the active regions (source and drain), for example, heavily-doped epitaxial layer 142', to form a low-resistance transition metal silicide. Any remaining transition metal may be removed by chemical etching, leaving silicide contacts only in the active regions. S/D contact plugs (not shown) may be further formed over the silicide material in subsequent process steps. In some embodiments, contact plugs comprises tungsten. In alternative embodiments, contact plugs comprise other metal or metal alloys such as aluminum, copper, or the like. Contact plugs can be formed using appropriate deposition and etching methods.

One benefit of exposing fin sidewall portion 146 is that additional contact area between heavily-doped epitaxial layer 142' and transistor region 150 through fin sidewall portion 146 will decrease contact resistance. Another benefit of the heavily-doped contact layer in accordance with this disclosure is that both n-type and p-type doping can be achieved with very high doping levels in the heavily-doped epitaxial layer and minimal diffusion into the underlying material. Further, layout design rules for incorporating a heavily-doped contact layer between S/D regions and the silicide contact layer in n-channel finFET S/D structures are the same as the layout design rules for p-channel finFET S/D structures.

Figure 5:
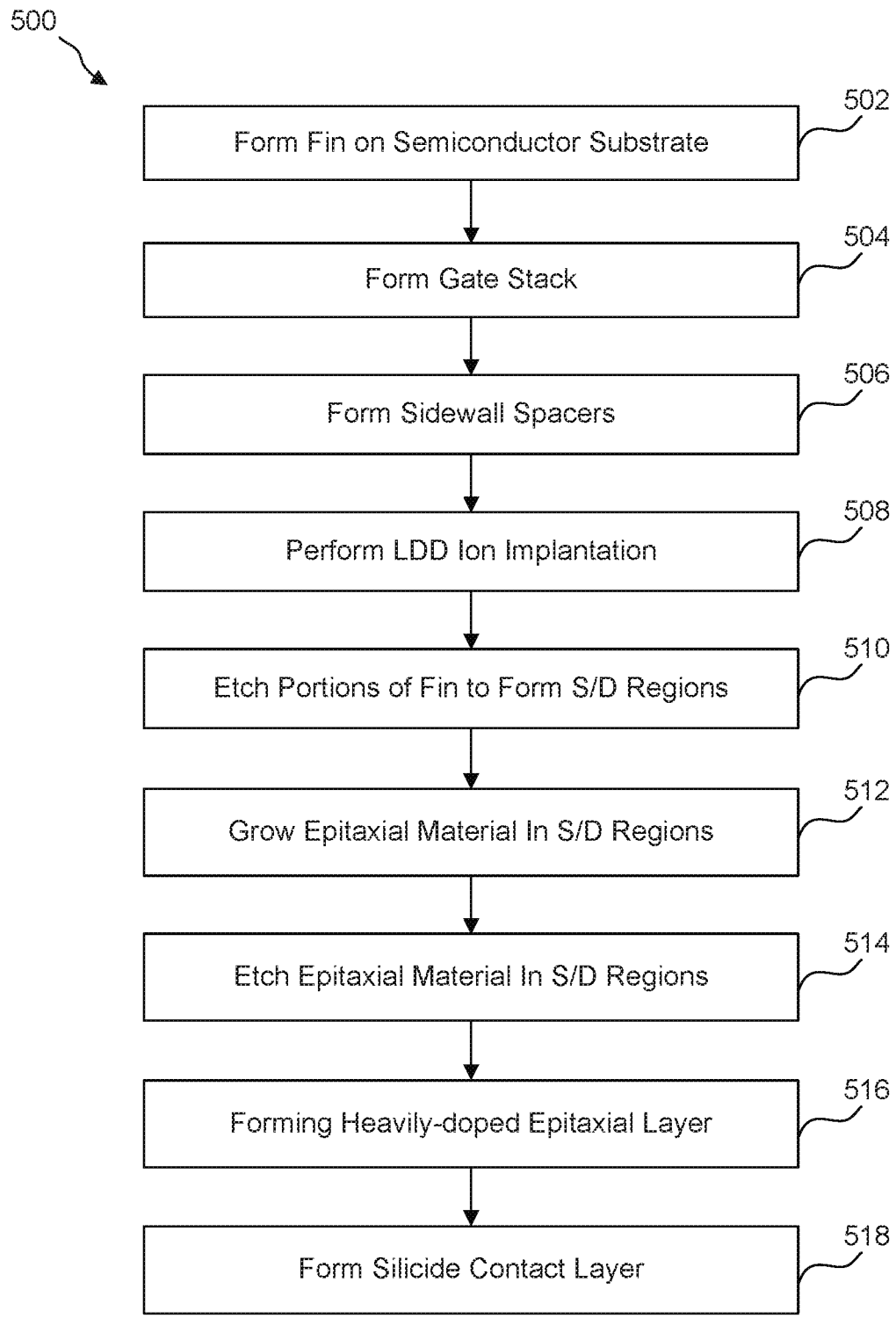
FIG. 5 is a flow diagram illustrating an exemplary method, according to this disclosure.

FIG. 5 is a flow diagram of an illustrative method 500 of forming S/D structures having lower contact resistance as compared to previously used S/D structures. Other fabrication steps may be performed between the various steps of method 500, and are omitted merely for clarity.

Method 500 begins with a semiconductor substrate. For example, the semiconductor substrate is a bulk Si wafer. Alternative embodiments may use other semiconductor materials. Method 500 includes operation 502, patterning a semiconductor substrate to form a fin. The fin is vertical, i.e., it is nominally perpendicular to the surface of the substrate, and the fin may be rectangular or trapezoidal. In some embodiments the fin may have rounded corners where its top surface and sidewalls meet. The fin may be formed using a variety of dry etch techniques such as reactive ion etching or inductively coupled plasma etching.

Method 500 continues with operation 504, forming a gate stack on the fin, the gate stack having a first sidewall and a second sidewall. Forming the gate stack includes forming a gate dielectric on the fin, and then forming a gate electrode over the gate dielectric. Examples of gate dielectrics include, but are not limited to, one or more of silicon dioxide, silicon nitride, and high-k dielectric materials. The gate electrode may include a stack of various metal and metal alloy layers, or polysilicon.

Method 500 continues with operation 506, forming a first sidewall spacer adjacent to the first sidewall, and a second sidewall spacer adjacent to the second sidewall. The first and second sidewall spacers are typically formed at the same time by an etch-back of a blanket layer. In alternative embodiments the first and second sidewall spacers may be formed of two or more layers of material.

Method 500 continues with operation 508, performing LDD ion implantation on substrate 102 to dope LDD regions 113. LDD regions 113 are formed in the fin structure between opposing spacers. An ion implantation is performed to form LDD regions 113, and may utilize any suitable doping species. After the dopant ions are implanted, a thermal anneal is performed to drive in and to activate the dopants.

Method 500 continues with operation 510, etching exposed portions of the fin. These exposed portions of the fin are those portions that are not covered by the gate stack or spacers. Because the gate stack and the spacers act as masking materials, they protect the fin underneath them from being etching. This etching may continue until the etched portions of the fin are recessed below the neighboring isolation material. This etching process may also stop before the etched portions of the fin are recessed below the neighboring isolation material. This exposed recessed interface acts as a nucleation site for subsequent epitaxial growth of materials.

Method 500 continues with operation 512, epitaxially growing material on the recessed interface to form S/D regions. The epitaxially-grown material may be a silicon-based material and may be formed by an epitaxial deposition/partial etch process. The process forms epitaxial S/D regions, $110_S'$ and $110_D'$, in recesses 127. Doping processes may also be incorporated in-situ or after the deposition of silicon-based material. Doped epitaxial S/D regions are also self-aligned with the opening defined by opposing spacers 111.

Method 500 continues with operation 514, etching silicon-based material in the S/D regions. A top portion of doped drain region $110_D'$ is removed to form a drain region top surface 140. For ease of description, doped source region $110_S'$ is not shown in the figures. Drain region top surface 140 may be a planar surface in parallel with fin top surface 114. Drain region top surface 140 can take the form of any suitable shape configuration, and may additionally comprise sidewall portions that are not in parallel with fin top surface 114. The top portion of drain region $110_D'$ is removed using suitable processes including photolithography and etch processes. Drain region top surface 140 may be above the fin top surface 114, in accordance with some embodiments. Drain region top surface 140 may be below the fin top surface 114, in accordance with some other embodiments.

Method 500 continues with operation 516, forming heavily-doped epitaxial contact material in the S/D regions. First, an amorphous layer 142 may be formed substantially over the doped S/D regions $110_S'$ and $110_D'$ by a deposition or growth process. Amorphous layer 142 may include a semiconductor material or a semiconductor alloy material. Amorphous layer 142 may also be formed substantially over other regions of substrate 102. The thickness of amorphous layer 142 may be precisely controlled by the deposition process.

An ion implant process can be performed in-situ or after the deposition of amorphous layer 142, and may utilize any suitable doping species. Both n-type and p-type transistors can be fabricated using appropriate doping procedures. The dopant concentration of amorphous silicon-based material can be adjusted to a higher level compared to a maximum dopant concentration of crystalline silicon-based material, providing the benefit of lowering the contact resistance.

A crystallization process is then used to crystallize the amorphous layer 142 using the crystalline semiconductor structures of epitaxial doped drain region 110$_D$' and/or fin sidewall portion 146 as crystal templates. An example method of crystallizing a layer of amorphous semiconductor material is the SPE regrowth process. The annealing process may enable SPE regrowth to occur in the amorphous layer 142, starting from the interface of amorphous layer 142 and drain region top surface 140, and/or the interface of amorphous layer 142 and fin sidewall portion 146. As a result of the SPE regrowth, amorphous layer 142 is converted to heavily-doped epitaxial layer 142'.

The SPE regrowth may also allow heavily-doped epitaxial layer 142' to take on the crystal orientation of the seed layer and may thus allow heavily-doped epitaxial layer 142' to have a variety of different crystal orientations. The SPE regrowth process may also allow amorphous layer 142 and doped source region 110$_D$' to be different materials.

Uncrystallized amorphous material is selectively removed through an etching process. The thickness of heavily-doped epitaxial layer 142' may be in a range of 1-10 nm.

Method 500 continues with operation 518, forming a contact layer in the S/D regions for providing electrical connections. In this exemplary embodiment, the contact layer is a low-resistance metal silicide.

Incorporating a heavily-doped contact layer between a S/D region and a silicide contact layer provides the benefit of reduced contact resistance compared to other contact structures. Another benefit of the heavily-doped contact layer in accordance with this disclosure is that both n-type and p-type doping can be achieved with very high doping levels in the contact layer and minimal diffusion into the underlying material. The thin heavily-doped contact layer may also leave a minimal footprint in a semiconductor structure. No change in layout design rules is needed since the heavily-doped contact is self-aligned to the S/D region. Further, layout design rules for incorporating a heavily-doped contact layer in n-channel finFET S/D structures are the same as the layout design rules for p-channel finFET S/D structures.

In one embodiment, a method of forming semiconductor structure with reduced contact resistance includes forming a fin on a substrate and forming a gate structure on the fin, the gate structure having a first sidewall and an opposing second sidewall. The method further includes forming a first sidewall spacer adjacent the first sidewall and forming a first source/drain (S/D) adjacent the first sidewall spacer. A dielectric layer is formed over the gate structure, the first sidewall spacer, and first S/D. A contact opening is formed through the dielectric layer such that a portion of the first S/D structure is exposed. A layer of doped amorphous material is formed over the gate structure, the first sidewall spacer, and the exposed portion of the first S/D. The method further includes crystallizing a portion of the layer of doped amorphous material to form a region of crystallized material.

In another embodiment, a semiconductor structure includes a fin on a substrate and a gate structure on the fin. The gate structure is configured to have a first sidewall and an opposing second sidewall, a first sidewall spacer adjacent the first sidewall, and a first source/drain (S/D) adjacent the first sidewall spacer. The semiconductor structure further comprises a dielectric layer over the gate structure, the first sidewall spacer, and first S/D contact opening is configured to be formed through the dielectric layer such that a portion of the first S/D is exposed, and a layer of doped crystalline material is configured to be on the exposed portion of the first S/D.

In a further embodiment, a structure comprises a fin over a substrate, the fin having a top surface and a pair of opposing side surfaces, and a gate structure on the fin, the gate structure having a first sidewall. The structure further comprises a first sidewall spacer adjacent the first sidewall and a recess in the fin and adjacent the first sidewall spacer. The recess is configured to have a bottom surface and a sidewall. The structure also comprises a first source/drain (S/D), a portion of which is disposed in the recess, and a layer of doped crystalline material on the first S/D and directly on a portion of the recess sidewall.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin over a substrate;
   forming, on the fin, a gate structure having a sidewall;
   forming a sidewall spacer adjacent to the sidewall;
   doping a source/drain (S/D) region adjacent to the sidewall spacer;
   depositing a layer of doped amorphous material over the gate structure, the sidewall spacer, and the S/D region; and
   crystallizing a portion of the layer of doped amorphous material to form a region of crystallized material that comprises a doping concentration higher than a doping concentration of the S/D region.

2. The method of claim 1, wherein the substrate is a bulk silicon wafer.

3. The method of claim 1, wherein forming the gate structure comprises forming a gate dielectric on the fin, and forming a gate electrode over the gate dielectric.

4. The method of claim 1, wherein forming the sidewall spacer comprises depositing a spacer material in physical contact with at least a portion of the gate structure.

5. The method of claim 1, wherein doping the S/D region comprises implanting at least one dopant species into the fin.

6. The method of claim 1, wherein doping the S/D region comprises forming a recess in the fin and epitaxially growing a material in the recess.

7. The method of claim 1, wherein depositing the layer of doped amorphous material comprises depositing a layer of n-doped amorphous silicon.

8. The method of claim 1, wherein depositing the layer of doped amorphous material comprises depositing a layer of n-doped amorphous silicon having a doping concentration in a range of about $5\times10^{20}$ atoms/cm$^3$ to about $7\times10^{21}$ atoms/cm$^3$.

9. The method of claim 1, wherein depositing the layer of doped amorphous material comprises depositing a layer of n-doped amorphous silicon germanium.

10. The method of claim 1, wherein depositing the layer of doped amorphous material comprises depositing a layer of n-doped amorphous silicon germanium having a doping concentration in the range of about $5\times10^{20}$ atoms/cm$^3$ to about $7\times10^{21}$ atoms/cm$^3$.

11. The method of claim 1, wherein crystallizing the portion of the layer of doped amorphous silicon comprises performing a solid phase epitaxial regrowth at a temperature of about 600° C.

12. The method of claim 11, further comprising removing the doped amorphous silicon after the solid phase epitaxial regrowth.

13. The method of claim 9, wherein crystallizing the portion of the layer of doped amorphous silicon germanium comprises performing a solid phase epitaxial regrowth at a temperature of about 500° C.

14. The method of claim 13, further comprising removing the doped amorphous silicon germanium after the solid phase epitaxial regrowth.

15. The method of claim 1 further comprising:
depositing a metal silicide on the crystallized material; and
forming a contact plug over the metal silicide.

16. A method, comprising:
forming a fin over a substrate;
forming, on the fin, a gate structure on the fin with a sidewall;
forming a sidewall spacer adjacent to the sidewall;
doping a source/drain (S/D) region adjacent to the sidewall spacer, a portion of the S/D region being disposed in the fin;
depositing a layer of doped amorphous material over the gate structure, the sidewall spacer, and the S/D region; and
crystallizing a portion of the layer of doped amorphous material to form a region of crystallized material that comprises a doping concentration higher than a doping concentration of the S/D region.

17. The method of claim 16, wherein the substrate is a bulk silicon wafer.

18. The method of claim 16, wherein forming the gate structure comprises forming a gate dielectric on the fin, and forming a gate electrode over the gate dielectric.

19. The method of claim 16, wherein forming the sidewall spacer comprises depositing a spacer material in physical contact with at least a portion of the gate structure.

20. A method, comprising:
forming a fin over a substrate;
forming, over the fin, a first gate structure with a first sidewall and a first spacer formed thereon;
forming, over the fin, a second gate structure with a second sidewall and a second spacer formed thereon, the second spacer opposing the first spacer;
doping a source/drain (S/D) region in the fin between the first spacer and the second spacer;
depositing a layer of doped amorphous material over the gate structure, the sidewall spacer, and the S/D region; and
crystallizing a portion of the layer of doped amorphous material to form a region of crystallized material that comprises a doping concentration higher than a doping concentration of the S/D region.

* * * * *